United States Patent
Yin et al.

(10) Patent No.: US 9,536,642 B2
(45) Date of Patent: Jan. 3, 2017

(54) HYBRID DIELECTRIC FILM FOR HIGH TEMPERATURE APPLICATION

(71) Applicant: GENERAL ELECTRIC COMPANY, Schenectady, NY (US)

(72) Inventors: Weijun Yin, Niskayuna, NY (US); Min Yan, Niskayuna, NY (US); Ri-An Zhao, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 293 days.

(21) Appl. No.: 14/511,973

(22) Filed: Oct. 10, 2014

(65) Prior Publication Data
US 2015/0030785 A1 Jan. 29, 2015

Related U.S. Application Data (62) Division of application No. 13/241,686, filed on Sep. 23, 2011, now Pat. No. 8,884,476.

(51) Int. Cl.
*C23C 14/06* (2006.01)
*C23C 16/30* (2006.01)
(Continued)

(52) U.S. Cl.
CPC ............ *H01B 19/04* (2013.01); *B32B 27/281* (2013.01); *C23C 14/00* (2013.01); *C23C 14/562* (2013.01); *C23C 16/545* (2013.01); *H01B 3/306* (2013.01); *H01B 7/292* (2013.01); *H01B 17/60* (2013.01); *Y10T 29/49885* (2015.01);
(Continued)

(58) Field of Classification Search
CPC .......... C23C 14/06; C23C 14/08; C23C 16/30; C23C 16/40; C23C 16/308; C23C 16/32; C23C 16/34; H05H 1/24
See application file for complete search history.

(56) References Cited

U.S. PATENT DOCUMENTS

| 4,342,814 A | 8/1982 | Usuki et al. |
| 5,350,638 A | 9/1994 | Sawada et al. |

(Continued)

FOREIGN PATENT DOCUMENTS

| CN | 176134 A | 4/2006 |
| CN | 2879358 Y | 3/2007 |

(Continued)

OTHER PUBLICATIONS

Zobir bin Hussein, Mohd, et al., "Acid fuchsin-interleaved Mg-Al-layered double hydroxide for the formation of an organic-inorganic hybrid nanocomposite". Materials Letters 58 (2004) 329-332.*

(Continued)

*Primary Examiner* — Bret Chen
(74) *Attorney, Agent, or Firm* — John P. Darling (57) ABSTRACT

A high-temperature insulation assembly for use in high-temperature electrical machines and a method for forming a high-temperature insulation assembly for insulating conducting material in a high-temperature electrical machine. The assembly includes a polymeric film and at least one ceramic coating disposed on the polymeric film. The polymeric film is disposed over conductive wiring or used as a conductor winding insulator for phase separation and slot liner.

12 Claims, 4 Drawing Sheets

(51) Int. Cl.
  *H01B 19/04*   (2006.01)
  *B32B 27/28*   (2006.01)
  *H01B 3/30*    (2006.01)
  *H01B 7/29*    (2006.01)
  *C23C 14/56*   (2006.01)
  *C23C 16/54*   (2006.01)
  *C23C 14/00*   (2006.01)
  *H01B 17/60*   (2006.01)

(52) U.S. Cl.
  CPC ...... *Y10T 428/2495* (2015.01); *Y10T 428/265* (2015.01); *Y10T 428/3154* (2015.04); *Y10T 428/31721* (2015.04); *Y10T 428/31725* (2015.04); *Y10T 428/31855* (2015.04)

(56) References Cited

U.S. PATENT DOCUMENTS

| | | | |
|---|---|---|---|
| 5,562,957 | A | 10/1996 | Hilden |
| 5,563,957 | A | 10/1996 | Hlden |
| 6,638,575 | B1 * | 10/2003 | Chen ............... B01D 67/0072 427/446 |
| 7,939,764 | B2 | 5/2011 | Gottfried et al. |
| 2004/0076842 | A1 | 4/2004 | Ishigaki et al. |
| 2008/0092814 | A1 | 4/2008 | Yan et al. |
| 2009/0081435 | A1 | 3/2009 | Gottfried et al. |
| 2009/0128019 | A1 | 5/2009 | Schaepkens et al. |
| 2009/0208715 | A1 * | 8/2009 | Stowell ............... C23C 16/308 428/213 |
| 2010/0310860 | A1 * | 12/2010 | Jung ............... C04B 35/14 428/332 |
| 2016/0169988 | A1 * | 6/2016 | Sirringhaus ........ G01R 33/1284 324/251 |

FOREIGN PATENT DOCUMENTS

| | | |
|---|---|---|
| EP | 1786006 A1 | 5/2007 |
| EP | 2495922 A2 | 9/2012 |
| JP | 4061711 A | 2/1992 |

OTHER PUBLICATIONS

Stimpfling, Thomas, et al., "Phosphate-Based Organic Molecules Interleaved with Layered Double Hydroxide: Unraveling the Roles of Host Cations and the Guest-Inhibiting Effect in Aluminum Corrosion Protection". European Journal of Inorganic Chemistry, 2012, 5396-5404.*

Abid, H., et al., "Phase transition in organic-inorganic perovskite (C9H19NH3)2 Pbl2Br2 of long-chain alkylammonium". Results in Physics 2 (2012) 71-76.*

Unofficial English Translation of Chinese Office Action issued in connection with corresponding CN Application No. 201280046197.1 on Jul. 16, 2015.

Search Rcpert and Written Opinion from corresponding PCT Application No. PCT/US2012/056499 dated Feb. 13, 2013.

* cited by examiner

HYBRID DIELECTRIC FILM FOR HIGH TEMPERATURE APPLICATION

CROSS REFERENCE TO RELATED APPLICATION

This application is a divisional of U.S. application Ser. No. 13/241,686, filed Sep. 23, 2011, now U.S Pat. No. 8,884,476.

BACKGROUND

The disclosure relates generally to an assembly having, and a method providing, improvement in thermal oxidation and corona discharge resistance, and more particularly to an assembly and a method for forming a flexible high heat resistant dielectric material.

Polymeric films are known to have utility as insulating materials in motors and generators. Known polymeric films serve as dielectric materials insulating conducting materials from other conducting materials to inhibit shorting, or short circuiting, of an electrical connection. Insulation provides protection against voltage hazards and inhibits leakage of current as well as electric discharge and short circuits.

Figure 1:
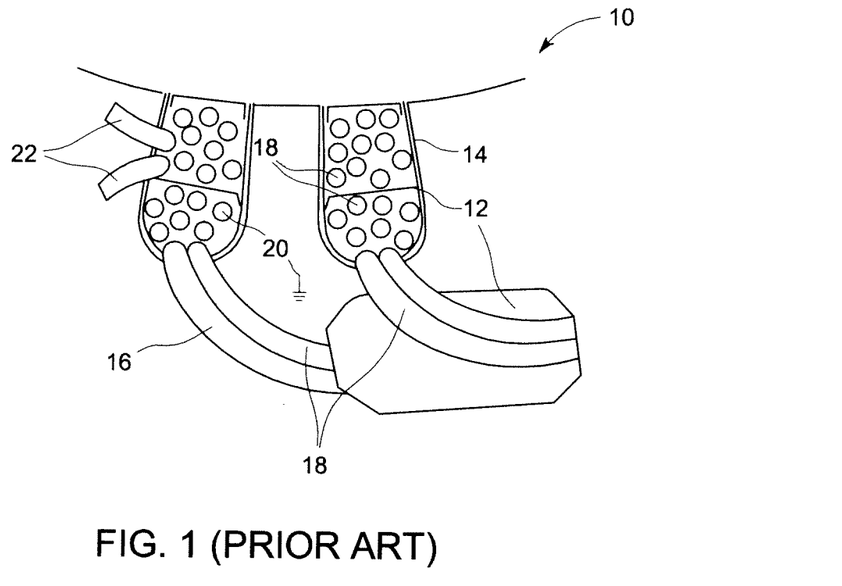
FIG. 1 is a schematic depiction of a section of a motor showing various locations where insulation is used.

FIG. 1 illustrates schematically a section of a motor 10. Polymeric films are used as insulating materials in various locations. For example, polymeric films are used as phase insulation/end winding insulation 12. Also, polymeric films are used as ground insulation/slot liners 14. Polymeric films can also be used as turn insulation 16, a copper wire coating. Wound wires 18, 20 and 22 are positioned relative to a voltage stress level in the motor 10. For an AC motor or generator, usually there are three voltage phases, 120 degree apart. Wound wire 18 generally refers to wires next to each other in two different phases, where it has the highest voltage drop, so insulator in addition to wire coating is needed to separate these phase-to-phase voltage drops. The wound wire 20 generally refers to a wire next to the steel core (or steel laminates) which is grounded. The voltage between the wire 20 and the core is the line voltage to ground which is also high, so ground insulation in addition to wire coating is needed. Wound wire 22 refers to wires next to each other in the same voltage phase, where the voltage drop is the least, so the coating on the conductive wire may provide sufficient insulation.

The polymeric films that are currently used in motors and generators are formed of one or more of cross-linked polyethylene, polypropylene, polyester, polycarbonate, polyurethane, polyphenylene oxide, high heat polymer films such as polyimide, aromatic polyimide, aromatic polyester, polyetherimide, polyamideimide, polyphenylene sulfide, polyphenylene sulfone, polyetheretherketone (PEEK), polytetrafluoroethylene (PTFE) and other fluoropolymers.

Film-like material is often used with conducting materials like wires used in electrical machines because such material lends flexibility. Flexibility is needed in that the conducting materials often are wound or are maintained in curved and/or non-planar orientations. To properly coat such conducting materials without creating undue stress on the conducting materials, thin film-like materials are used. Film-like materials are also frequently used as phase separation and slot liners for winding wires. Flexibility and abrasion resistance of films are needed for them to survive the mechanical stress during manufacturing assembly processes.

However, disadvantages exist in known polymeric films used to insulate conducting materials within motors and/or generators. Currently known polymeric films have heat stability or thermal index only up to 260° C. What is meant by "heat stability" or "thermal index" is that the material's dielectric and/or mechanical integrity is intact after 20,000 hours of thermal aging at 260° C. The standard test method used for defining thermal index can be found in ASTM D2307. Newer motors and generators require materials which can withstand higher heat than 260° C., and therefore often are manufactured to operate at higher temperatures.

Previous generation electric drives mostly operated with line voltage operated at a constant frequency unlike newer pulse-width modulated (PWM) driven motor/drives driven by high dV/dT PWM drives and operated near or higher than Partial Discharge Inception Voltages (PDIV) or corona inception voltage (CIV).

In addition, limited volume/space limits the separation and spacing of high voltage signals/power lines in electric machine windings as well as cabling and power electronics combined with low pressure with high temperature often results in the operation near or higher than PDIV/CIV for electric discharge.

Where polymeric film is used in high temperature applications, mica, ceramic and glass tape have been traditionally employed to provide greater heat resistance. However, because of their rigidity and low dielectric strength, high thickness is required to achieve proper dielectric strength. The size and weight of power units utilizing these types of insulation tends to be large and heavy, respectively, and thus power density of the system as a whole is sacrificed.

Another disadvantage is that known polymeric films can only withstand corona discharges for a limited period of time. For example, in an experiment run by the inventors a polyimide film was exposed to a 20 kilohertz (kHz) continuous square wave pulse. The polyimide film lasted less than 10 minutes without degrading to the point of breaking down, or short circuiting.

Given the known disadvantages of the current state of the art of insulating films, an improved insulation assembly and method for insulating conducting materials in an electrical machine would be welcome in the art.

SUMMARY

An embodiment of the disclosure includes a high-temperature insulation assembly for use in high-temperature electrical machines. The assembly includes a polymeric film and at least one ceramic coating disposed on the polymeric film. The polymeric film is disposed either over conductive wiring or used as conductor winding insulator.

Another embodiment of the disclosure includes an electrical machine that includes a motor or generator comprising conductive wiring wound in non-planar orientations and an insulation assembly for insulating the conductive wiring. The insulation assembly includes a polymeric film and at least one ceramic coating disposed on the polymeric film. The polymeric film is disposed over the conductive wiring or used for conductor winding insulator.

One embodiment includes a method for forming a high-temperature insulation assembly for insulating conducting material in a high-temperature electrical machine. The method includes depositing at least one layer of a ceramic material on a polymeric film and disposing the at least one layer of a ceramic material and the polymeric film adjacent to a conducting material.

These and other features, aspects and advantages may be further understood and/or illustrated when the following detailed description is considered along with the attached drawings.

DETAILED DESCRIPTION

The present specification provides certain definitions and methods to better define the embodiments and aspects of the system/method and to guide those of ordinary skill in the art in the practice of its fabrication. Provision, or lack of the provision, of a definition for a particular term or phrase is not meant to imply any particular importance, or lack thereof; rather, and unless otherwise noted, terms are to be understood according to conventional usage by those of ordinary skill in the relevant art.

Unless defined otherwise, technical and scientific terms used herein have the same meaning as is commonly understood by one of skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced item, and the terms "front", "back", "bottom", and/or "top", unless otherwise noted, are merely used for convenience of description, and are not limited to any one position or spatial orientation.

The modifier "about" used in connection with a quantity is inclusive of the stated value and has the meaning dictated by the context (e.g., includes the degree of error associated with measurement of the particular quantity). Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described inventive features may be combined in any suitable manner in the various embodiments.

Figure 2:
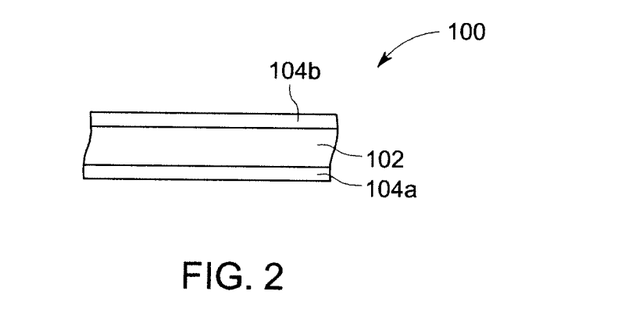
FIG. 2 is a schematic depiction of an insulation assembly in accordance with an embodiment.

As illustrated in FIG. 2, there is shown therein an insulation separator assembly 100. The insulation separator 100 includes a polymeric film 102 sandwiched between first and second ceramic coatings 104a, 104b.

The polymeric film 102 may be formed of one or more of cross-linked polyethylene, polypropylene, polyester, polycarbonate, polyurethane, high heat polymer films such as polyimide, aromatic polyimide, aromatic polyester, polyetherimide, polyamideimide, polyetheretherketone (PEEK), and polytetrafluoroethylene (PTFE). Alternatively, the polymeric film 102 may be formed of any number of other suitable materials, such as, for example, polyphenylene oxide, polyphenylene sulfone, polyether sulfone, polyphenylene sulfide, or other suitable fluoropolymers such as perfluoroalkoxy (PFA), polyvinylidene fluoride (PVDF), fluoroethylene-propylene (FEP), ethylene-tetrafluoroethylene copolymer (ECTFE), and polychlorotrifluoroethylene (PCTFE) to name a few.

Each of the ceramic coatings 104a, 104b may be formed of a single layer or of many layers of the coatings. Further, the ceramic coatings 104a, 104b both may, instead of sandwiching polymeric film 102, be on one side of the polymeric film. The ceramic coatings 104a, 104b each may be formed of one or more inorganic materials. More specifically, the ceramic coatings 104a, 104b each may be formed of silicon nitride; silicon oxide; silicon oxynitride; aluminum oxide; zirconium oxide; combinations of elements of Groups IIA, IIIA, IVA, VA, VIA, VIIA, IB, and IIB; metals of Groups IIIB, IVB, and VB; rare-earth metals; and, any combinations thereof.

Alternatively, the ceramic coatings 104a, 104b each may be formed of one or more organic materials. More specifically, the ceramic coatings 104a, 104b each may be formed of silicon carbide, organometallic silanes, or forms of ceramic coating after sintering.

The ceramic coating 104a may be formed of different materials than the ceramic coating 104b. For example, ceramic coating 104a may be formed of inorganic materials, while the ceramic coating 104b may be formed of organic materials. Alternatively, each of the ceramic coatings 104a, 104b may be formed of different inorganic materials.

Figure 3:
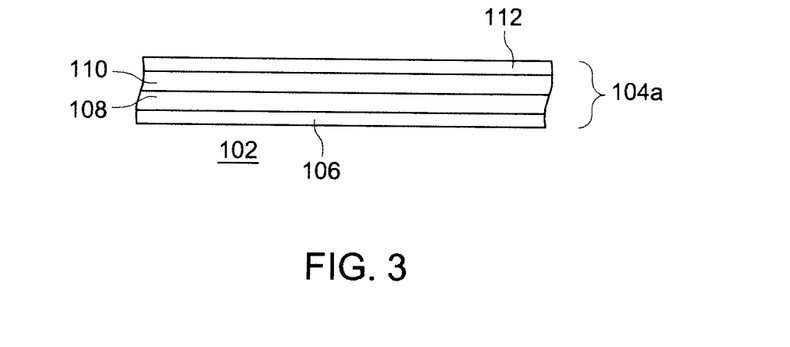
FIG. 3 is a schematic depiction of a ceramic coating in accordance with an embodiment.

An exemplary ceramic coating 104a is shown in FIG. 3. It should be understood that ceramic coating 104b can also be similarly formed. A first coating layer 106 is deposited on the polymeric film 102. The first coating layer 106 may be organic or inorganic in nature. A second coating layer 108 then may be deposited on the first coating layer 106. The second coating layer 108 may be organic or inorganic in nature. In one embodiment, the second coating layer 108 is formed of the same material as the first coating layer 106. In one embodiment, the second coating layer 108 is formed of the same type of material, i.e., organic or inorganic, as the first coating layer 106 but formed of a different material of that type. For example, in one embodiment, the first coating layer 106 is formed of silicon nitride (SiNx, where x is between about 0.6 and 2.0; hereinafter referred to as SiN) and the second coating layer 108 is formed of silicon carbide (SiCx, where x is between about 1.0 and 2.0; hereinafter referred to as SiC).

A third coating layer 110 may be deposited on the second coating layer 108. The third coating layer 110 may be organic or inorganic in nature. In one embodiment, the third coating layer 110 is formed of the same material as the first coating layer 106. In one embodiment, the third coating layer 110 is formed of the same material as the second coating layer 108. In one embodiment, the third coating layer 110 is formed of the same type of material, i.e., organic or inorganic, as the first coating layer 106 but formed of a different material of that type. In one embodiment, the third coating layer 110 is formed of the same type of material as the second coating layer 108 but formed of a different material of that type. In one embodiment, the first coating layer 106 is formed of SiN, the second coating layer 108 is formed of SiC, and the third coating layer 110 is formed of SiN. In one embodiment, the first and second coating layers 106, 108 are formed of SiN and the third coating layer 110 is formed of SiC. In one embodiment, the first coating layer 106 is formed of SiN, the second coating layer 108 is formed of SiC, and the third coating layer 110 is formed of aluminum oxide ($Al_2O_3$).

A fourth coating layer 112 may be deposited on the third coating layer 110. The fourth coating layer 112 may be organic or inorganic in nature. In one embodiment, the fourth coating layer 112 is formed of the same material as the first coating layer 106, the second coating material 108, and/or the third coating layer 110. In one embodiment, the third coating layer 110 is formed of the same type of material, i.e., organic or inorganic, as the first, second and/or third coating layers 106, 108, 110 but formed of a different material of that type. In one embodiment, the first, second and/or third coating layers 106, 108, 110 are formed of SiN and the fourth coating layer 112 is formed of SiC. In one embodiment, the first, second and third coating layers 106, 108, 110 are formed of SiN and the fourth coating layer 112 is formed of $Al_2O_3$. In one embodiment, the first coating layer 106 is formed of SiC, the second coating layer 108 is formed of SiN, the third coating layer 110 is formed of SiC, and the fourth coating layer 112 is formed of $Al_2O_3$.

It is to be understood that these embodiments are merely exemplary in nature and other materials and combinations of materials may be used. For example, it should be understood that the number of coating layers may be greater or less than the four layers depicted in FIG. 3. Further, inorganic materials may be deposited and gradually tuned to process conditions in which organic materials are then deposited.

The ceramic coatings 104a, 104b provide significant improvement in thermal oxidation resistance. Oxygen is a concern in that its presence accelerates degradation as well as affects the size of corona discharges.

The total thickness of the ceramic coatings 104a, 104b is determined upon the composition of the coatings as well as several competing factors, namely heat resistance and flexibility. The thickness, as well as the composition, of the ceramic coatings 104a, 104b has an effect on the heat resistance provided to the polymeric film 102. Providing a graded composition, i.e., a layer of one or several materials overlying a second layer of a different material(s), provides greater heat resistance than providing an ungraded composition of coating layers. Specifically, a graded composition improves adhesion between different materials by eliminating hard interfaces therebetween. Further, the thicker the composition, the greater the heat resistance provided.

However, the thicker the composition, the less flexibility that can be exhibited by the coated electrical component without generating excess stress leading to cracking of the ceramic coatings. One embodiment provides ceramic coatings 104a, 104b that are each in the submicron to nanometer range. One embodiment provides only a single ceramic coating instead of the paired ceramic coatings 104a, 104b.

The ceramic coatings 104a, 104b formed on the polymeric film 102 in the submicron to nanometer range provide a flexible, high heat resistant dielectric shield for protecting electrical components in high voltage and high temperature applications. Through forming a ceramic coating in the submicron to nanometer thickness range, the hybrid ceramic coating and polymer structure overcomes thermal oxidation and corona induced degradation while maintaining film flexibility. Such a structure can be used at temperatures higher than what traditional polymeric materials can survive, as well as at higher voltages and lower pressures, such as found in aviation and higher altitude applications. Such a structure can find utility in various high power density and high voltage applications, such as, for example, winding and film insulations for motors, transformers, generators, down hole electric motors, power electronic boards, and for power and energy capacitors.

Figure 4:
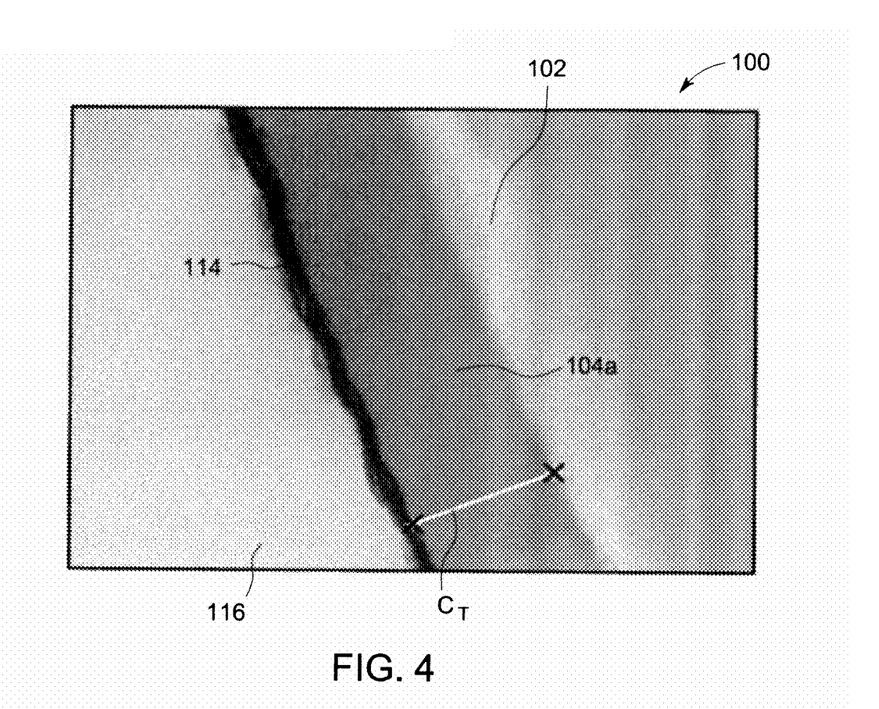
FIG. 4 is a transmission electron microscopy image depicting an insulation assembly in accordance with an embodiment.

Referring now to FIG. 4, there is shown a transmission electron microscopy (TEM) image of an insulation separator assembly 100. The insulation separator 100 includes a ceramic coating 104a disposed on a material 114 adhered to an epoxy material 116. The material 114 may be, for example, a conductive component. The ceramic coating 104a has a thickness $C_T$, which may be in the submicron to nanometer range. In one embodiment, the thickness $C_T$ is between about ten-thousand nanometers and one nanometer. In one embodiment, the thickness $C_T$ is between about 750 nanometers and 25 nanometers. In one embodiment, the thickness $C_T$ is between about 500 nanometers and 50 nanometers. In one embodiment, the thickness $C_T$ is between about 350 nanometers and 75 nanometers. In one embodiment, the thickness $C_T$ is between about 250 nanometers and 100 nanometers. In one embodiment, the thickness $C_T$ is 10 nanometers or less.

Figure 5:
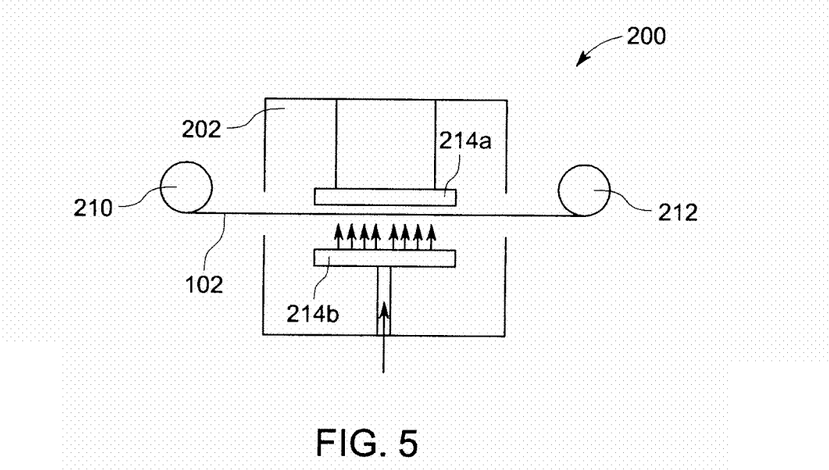
FIG. 5 is a schematic depiction of a deposition system for forming an insulation assembly in accordance with an embodiment.

With specific reference to FIG. 5, there is shown a deposition system 200 for depositing a ceramic coating on a polymeric film 102. The deposition system 200 includes a deposition chamber 202, a pair of spools 210, 212 and a deposition assembly 214a, 214b. A gas inlet allows for gas to enter the deposition chamber 202 to allow for deposition of material on the polymeric film 102.

The polymeric film 102 extends from unwinding spool 210 to winding spool 212. The spools 210, 212 provide sufficient tension for the polymeric film 102 as it travels through the deposition chamber 202. Although the spool 210 is termed an unwinding spool and spool 212 is termed a winding spool, it should be understood that the opposite can also be accurate. Furthermore, the spools 210, 212 are configures such that each can rotate in either a clockwise or a counter-clockwise direction. Thus, the spools 210, 212 can move the polymeric film 102 through the deposition chamber 202 in a direction from spool 210 to spool 212 or in an opposite direction. The ability to change the direction of movement of the polymeric film 102 allows for multiple layers of the ceramic coating to be applied to the polymeric film 102 in a continuous manner via a roll-to-roll mechanism. With the change in direction, new material for deposition can be input into the deposition chamber 202, allowing for a graded composition of ceramic coating on the polymeric film 102.

The deposition system 200 may be configured to allow for the continuous deposition of material in a suitable fashion. Embodiments of the deposition system are configured to allow for deposition by way of chemical-vapor deposition ("CVD"), plasma-enhanced chemical-vapor deposition ("PECVD"), radio-frequency plasma-enhanced chemical-vapor deposition ("RFPECVD"), expanding thermal-plasma chemical-vapor deposition ("ETPCVD"), sputtering, reactive sputtering, electron-cyclotron-resonance plasma-enhanced chemical-vapor deposition ("ECRPECVD"), inductively coupled plasma-enhanced chemical-vapor deposition ("ICPECVD"), an evaporative process, an atomic layer deposition process, a slurry coating, or combinations thereof Referring now to FIG. 6 there is shown a deposition system 300 that includes a deposition chamber 302, a pair of spools 210, 212 and a deposition assembly. The deposition chamber 302 includes a first deposition chamber 302 separated from a second deposition chamber 308 by a baffle 306. The presence of a pair of deposition chambers 302, 308 allows for a graded composition of ceramic material on the polymeric film in a continuous manner. Further, each of the deposition chambers 302, 308 can have different materials being deposited, with the baffle 306 preventing significant cross-contamination between deposition chambers.

Figure 6:
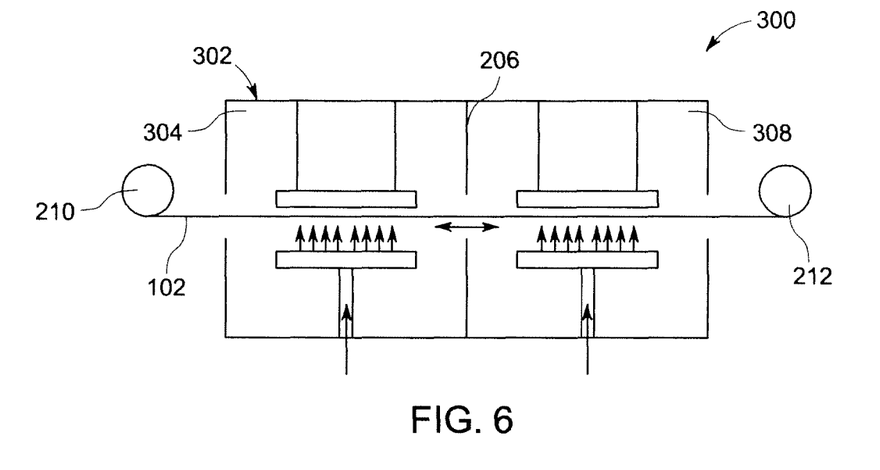
FIG. 6 is a schematic depiction of a deposition system for forming an insulation assembly in accordance with an embodiment.

It should be appreciated that more than two deposition chambers can be included within a deposition system. For more information on continuous deposition of materials on a film-like component, please see U.S. Pat. No. 7,976,899, issue date Jul. 12, 2011 and owned by a common assignee as the instant patent application. The entire contents of U.S. Pat. No. 7,976,899 is incorporated herein by reference.

Figure 7:
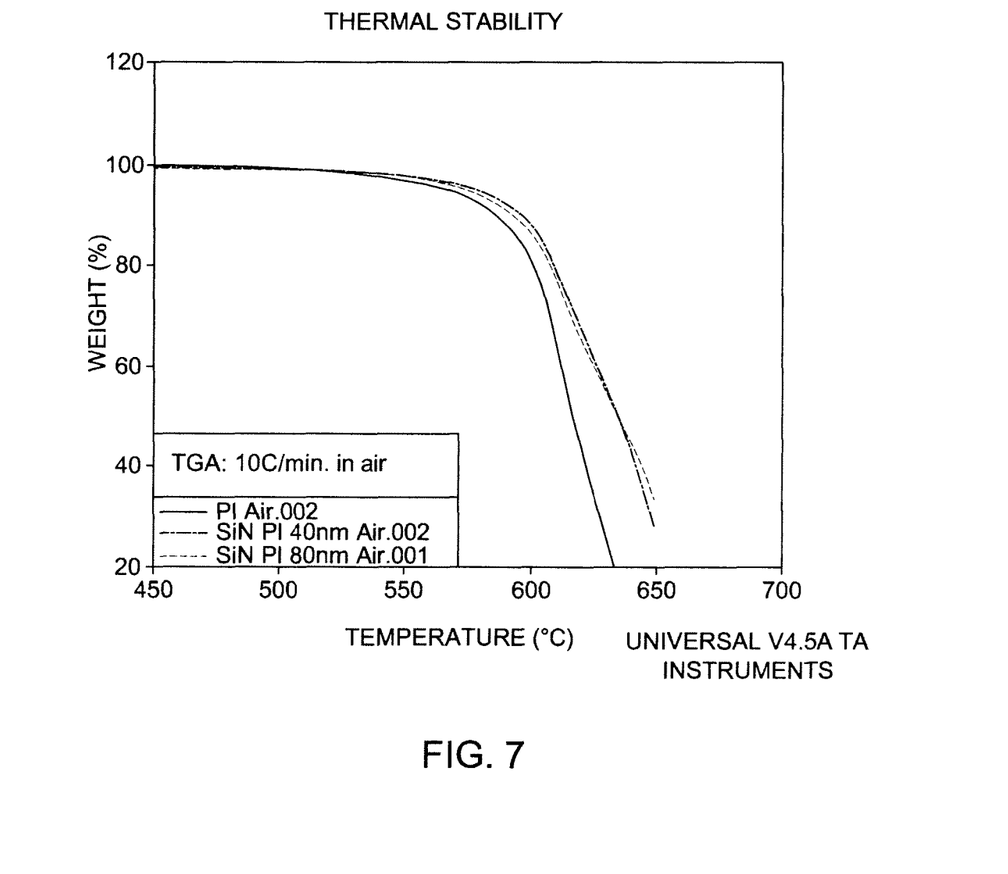
FIG. 7 is a graphical representation exhibiting the thermal stability of a known insulation assembly and insulation assemblies formed in accordance with an embodiment, plotting loss of weight in percentage against temperature for a temperature increase rate of 10° C./minute.

Referring now to FIG. 7, there is shown a graphical representation exhibiting the thermal stability of a known insulation assembly and insulation assemblies formed in accordance with an embodiment of the invention. The thermal gravimetric analysis providing the results displayed in FIG. 7 is based upon a temperature increase rate of 10° C./minute.

As temperature increases on a material, there will come a point at which the material begins to exhibit a heat-related degradation that can be measured by percentage of weight lost. Experiments indicate that a percentage of five to 10 weight percent lost in a material used for insulating a conductive component may lead to a shorting out of that conductive component. FIG. 7 exhibits thermal gravimetric analyses of polymeric film without a coating and polymeric film having a ceramic coating in accordance with embodiments of the invention. As shown in FIG. 7, in which the temperature change was at a rate of 10° C./minute, the temperature at which about five weight percent has been lost from the polymeric film without a coating is about 563° C. The temperature at which about 10 weight percent has been lost from the polymeric film without a ceramic coating is about 588° C. The temperature at which about five weight percent has been lost from the polymeric film with a ceramic coating in FIG. 7 is about 575° C. The temperature at which about 10 weight percent has been lost from the polymeric film with a ceramic coating is about 600° C.

Figure 8:
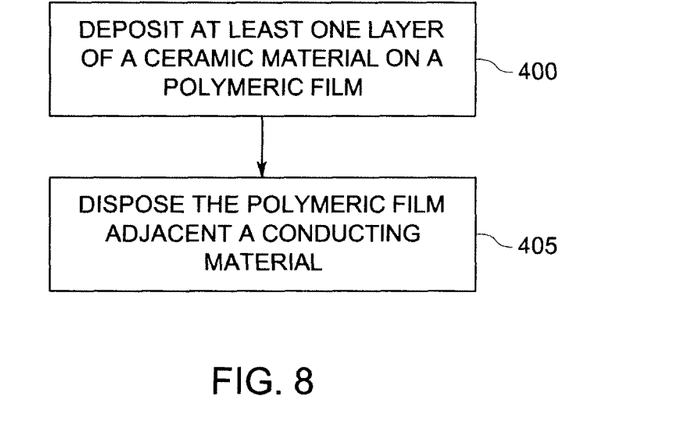
FIG. 8 depicts process steps for forming an insulation assembly about a conducting material in accordance with an embodiment.

With specific reference to FIG. 8, and with general reference to FIGS. 2-6, next will be described a method of forming a flexible, high heat resistant dielectric shield for protecting electrical components in high voltage and high temperature applications. At Step 400, at least one layer of a ceramic material is deposited onto a polymeric film, such as polymeric film 102. Step 400 may be accomplished in either a batch mode or a continuous mode. In a continuous mode, the polymeric film may be extended between a pair of spools and through a deposition chamber, such as deposition chambers 200 and/or 300. The polymeric film can be transmitted through the deposition chamber numerous times to obtain multiple layers of the ceramic coating and to form a graded ceramic coating composition.

Next, at Step 405 the polymeric film is disposed adjacent to a conducting material. The purpose of disposing adjacent to a conducting material is to provide insulation to the conducting material to inhibit shorting of the conducting material in high temperature environments and applications. Further, the ceramic coating provides corona discharge protection.

While the inventions have been described in detail in connection with only a limited number of embodiments, it should be readily understood that the inventions are not limited to such disclosed embodiments. Rather, the inventions can be modified to incorporate any number of variations, alterations, substitutions or equivalent arrangements not heretofore described, but which are commensurate with the spirit and scope of the inventions. For example, while embodiments have been described in terms that may initially connote singularity, it should be appreciated that multiple components may be utilized. Additionally, while various embodiments of the inventions have been described, it is to be understood that aspects of the inventions may include only some of the described embodiments. Accordingly, the inventions are not to be seen as limited by the foregoing description, but are only limited by the scope of the appended claims.

What is claimed is:

1. A method for forming a high-temperature insulation assembly, comprising:
    depositing at least one continuous single phase ceramic coating on a polymeric film, wherein the at least one ceramic coating comprises inorganic deposition material and organic deposition material, and the at least one continuous single phase ceramic coating comprises multiple layers of the inorganic deposition material interleaved between multiple layers of the organic deposition material; and
    disposing the at least one continuous single phase ceramic coating and the polymeric film thereby forming the insulation assembly, wherein the insulation assembly is located proximate a conducting material in an electrical machine.

2. The method of claim 1, wherein the at least one continuous single phase ceramic coating has a thickness in a range between about 1 nanometer and about 10,000 nanometers.

3. The method of claim 1, wherein the at least one ceramic coating comprises one or more from the group comprising silicon nitride, silicon oxide, silicon oxynitride, aluminum oxide, zirconium oxide, silicon carbide, and any combinations thereof.

4. The method of claim 1, wherein depositing comprises chemical-vapor deposition, plasma-enhanced chemical-vapor deposition, radio-frequency plasma-enhanced chemical-vapor deposition, expanding thermal-plasma chemical-vapor deposition, sputtering, reactive sputtering, electron-cyclotron-resonance plasma-enhanced chemical-vapor deposition, inductively coupled plasma-enhanced chemical-vapor deposition, an evaporative process, an atomic layer deposition process, a slurry coating, and combinations thereof.

5. The method of claim 1, wherein the at least one continuous single phase ceramic coating is disposed on both sides of the polymeric film.

6. The method of claim 1, wherein the at least one continuous single phase ceramic coating comprises two or more coatings.

7. The method of claim 6, wherein the coatings are at least one of different materials and different thicknesses.

8. The method of claim 1, wherein the high-temperature insulation assembly operates at temperatures above 220 degrees Celsius.

9. The method of claim 1, wherein the polymeric film comprises polyphenylene oxide, polyphenylene sulfone, polyether sulfone, polyphenylene sulfide, polyimide, aromatic polyimide, aromatic polyester, polyetherimide, polyamideimide, polyetheretherketone, polytetrafluoroethylene, polyvinylidene fluoride, fluorinated ethylene propylene, perfluoroalkoxy, and any combinations thereof.

10. The method of claim 1, wherein the at least one continuous single phase ceramic coating comprises a pair of ceramic coatings, wherein the polymeric film is sandwiched between the pair of the ceramic coatings.

11. The method of claim 1, wherein the at least one continuous single phase ceramic coating comprises silicon nitride; silicon oxide; silicon oxynitride; aluminum oxide; zirconium oxide; combinations of elements of Groups IIA, IIIA, IVA, VA, VIA, VIIA, IB, and IIB; metals of Groups IIIB, IVB, and VB; rare-earth metals; and, any combinations thereof.

12. The method of claim 11, wherein the at least one continuous single phase ceramic coating comprises silicon carbide, organometallic silanes, or forms of ceramic coating after sintering.

\* \* \* \* \*